(12) United States Patent
Yang et al.

(10) Patent No.: US 10,243,090 B2
(45) Date of Patent: Mar. 26, 2019

(54) SOLAR CELL AND METHOD FOR MANUFACTURING THE SAME

(71) Applicant: LG ELECTRONICS INC., Seoul (KR)

(72) Inventors: Youngsung Yang, Seoul (KR); Junghoon Choi, Seoul (KR); Changseo Park, Seoul (KR); Hyungjin Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/734,870

(22) Filed: Jun. 9, 2015

(65) Prior Publication Data

US 2015/0357507 A1    Dec. 10, 2015

(30) Foreign Application Priority Data

Jun. 10, 2014  (KR) .......................... 10-2014-0070322

(51) Int. Cl.
| | |
|---|---|
| *H01L 31/18* | (2006.01) |
| *H01L 31/0216* | (2014.01) |
| *H01L 31/0224* | (2006.01) |
| *H01L 31/0745* | (2012.01) |

(52) U.S. Cl.
CPC ........... *H01L 31/022441* (2013.01); *H01L 31/02167* (2013.01); *H01L 31/0745* (2013.01); *H01L 31/1804* (2013.01); *H01L 31/1864* (2013.01); *H01L 31/1872* (2013.01); *Y02E 10/547* (2013.01); *Y02P 70/521* (2015.11)

(58) Field of Classification Search
CPC ................... H01L 31/03682; H01L 31/02167
See application file for complete search history.

(56) References Cited

U.S. PATENT DOCUMENTS

| | | |
|---|---|---|
| 5,693,578 A | 12/1997 | Nakanishi et al. |
| 6,552,259 B1 | 4/2003 | Hosomi et al. |
| 7,468,485 B1 | 12/2008 | Swanson |
| 2009/0293948 A1 | 12/2009 | Tucci et al. |
| 2012/0000528 A1 | 1/2012 | Dennis et al. |
| 2012/0073650 A1 | 3/2012 | Smith et al. |
| 2012/0138135 A1 | 6/2012 | Manning |

(Continued)

FOREIGN PATENT DOCUMENTS

| | | |
|---|---|---|
| CN | 102959730 A | 3/2013 |
| CN | 103515477 A | 1/2014 |
| JP | 53-78190 A | 7/1978 |

(Continued)

OTHER PUBLICATIONS

English Abstract KR 20080105268, accessed Dec. 10, 2016.*

*Primary Examiner* — Shannon M Gardner
(74) *Attorney, Agent, or Firm* — Birch, Stewart, Kolasch & Birch, LLP

(57) ABSTRACT

Discussed is a method for manufacturing a solar cell. The method includes forming a tunneling layer on a semiconductor substrate; forming a semiconductor layer on the tunneling layer, wherein the forming of the semiconductor layer including depositing a semiconductor material; and forming an electrode connected to the semiconductor layer. The tunneling layer is formed under a temperature higher than room temperature and a pressure lower than atmospheric pressure.

18 Claims, 10 Drawing Sheets

(56) References Cited

U.S. PATENT DOCUMENTS

2012/0322199 A1  12/2012  Graff
2013/0344647 A1  12/2013  Cheong et al.

FOREIGN PATENT DOCUMENTS

| | | |
|---|---|---|
| JP | 2001-189483 A | 7/2001 |
| JP | 2003-124483 A | 4/2003 |
| JP | 2011-124603 A | 6/2011 |
| JP | 2013-538009 A | 10/2013 |
| KR | 10-2012-0035291 A | 4/2012 |
| KR | 10-2012-0068226 A | 6/2012 |
| KR | 10-2014-0003692 A | 1/2014 |
| KR | 10-2014-0021730 A | 2/2014 |
| WO | WO 2014/099308 A1 | 6/2014 |

\* cited by examiner

100a

SOLAR CELL AND METHOD FOR MANUFACTURING THE SAME

CROSS-REFERENCE TO RELATED APPLICATION

This application claims the priority benefit of Korean Patent Application No. 10-2014-0070322, filed on Jun. 10, 2014 in the Korean Intellectual Property Office, the disclosure of which is incorporated herein by reference.

BACKGROUND OF THE INVENTION

1. Field of the Invention

Embodiments of the invention relate to a solar cell and a method for manufacturing the same and, more particularly, to a solar cell having a tunneling structure and a method for manufacturing the same.

2. Description of the Related Art

In recent years, as conventional energy resources such as petroleum and coal are running out, interest in alternative energy resources for replacing these energy resources is on the rise. Of these, solar cells are attracting considerable attention as next generation cells which convert solar energy into electrical energy.

Such a solar cell is manufactured by forming various layers and electrodes according to a design. Efficiency of solar cells may be determined according to the design of various layers and electrodes. Low efficiency should be overcome so that solar cells can be put to practical use. Accordingly, various layers and electrodes should be designed such that solar cell efficiency is maximized. Also, a method for manufacturing a solar cell having various layers and electrodes should be simplified.

SUMMARY OF THE INVENTION

Embodiments of the invention provide a solar cell having enhanced efficiency and a method for manufacturing a solar cell having a simplified manufacturing process.

A method for manufacturing a solar cell includes forming a tunneling layer on a semiconductor substrate; forming a semiconductor layer on the tunneling layer, wherein the forming of the semiconductor layer including depositing a semiconductor material; and forming an electrode connected to the semiconductor layer. The tunneling layer is formed under a temperature higher than room temperature and a pressure lower than atmospheric pressure.

A solar cell manufactured by a method according to the above includes a tunneling layer having a thickness of about 2 nm or less.

DETAILED DESCRIPTION OF THE EMBODIMENTS

Figure 1:
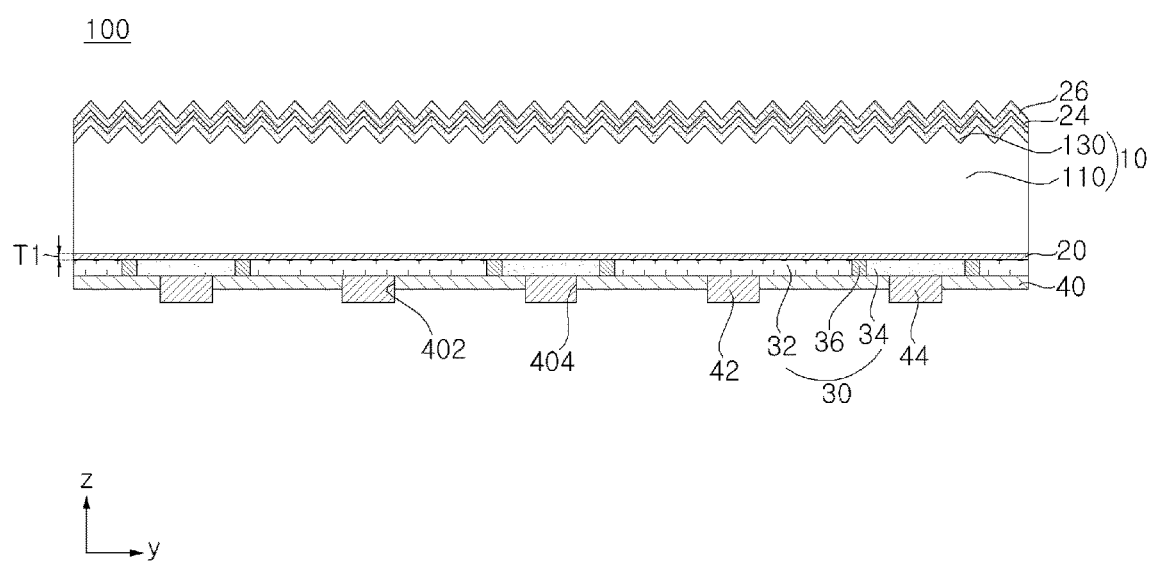
FIG. 1 is a sectional view of an example of a solar cell manufactured by a method for manufacturing a solar cell according to an embodiment of the invention.

Reference will now be made in detail to embodiments of the invention, examples of which are illustrated in the accompanying drawings. However, the invention may be embodied in many different forms and should not be construed as limited to the embodiments set forth herein.

Only elements constituting features of the invention are illustrated in the accompanying drawings and other elements that do not constitute features of the invention will not be described herein and omitted from the drawings, for clarity of description. Like reference numerals refer to like elements throughout. In the drawings, the thicknesses, areas, etc., of constituent elements may be exaggerated or reduced for clarity and convenience of illustration. The embodiments of the invention are not limited to the illustrated thicknesses, areas, etc.

It will be further understood that, throughout this specification, when one element is referred to as "comprising" or "including" another element, the term "comprising" or "including" specifies the presence of another element but does not preclude the presence of other additional elements, unless context clearly indicates otherwise. In addition, it will be understood that when one element such as a layer, a region or a plate is referred to as being "on" another element, the one element may be directly on the another element, and one or more intervening elements may also be present. In contrast, when one element such as a layer, a region or a plate is referred to as being "directly on" another element, one or more intervening elements are not present.

Hereinafter, a method for manufacturing a solar cell according to an embodiment of the invention will be described in detail with reference to the accompanying drawings. An example of a solar cell manufactured by a method for manufacturing a solar cell according to an embodiment of the invention will be described, and then, the method for manufacturing the solar cell according to the embodiment of the invention will be described.

Figure 2:
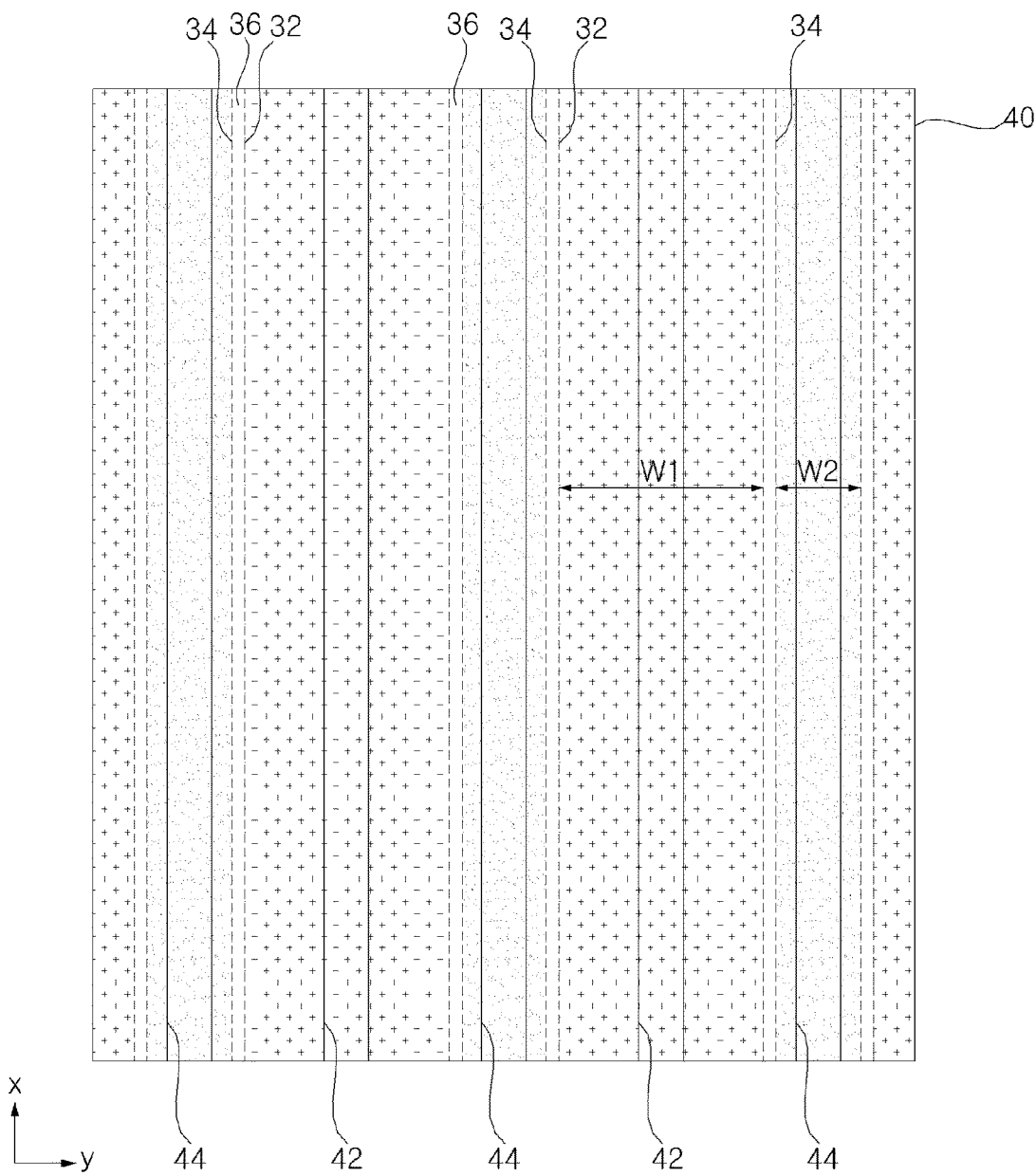
FIG. 2 is a partial rear plan view of the solar cell illustrated in FIG. 1.

FIG. 1 is a sectional view of an example of a solar cell manufactured by a method for manufacturing a solar cell according to an embodiment of the invention, and FIG. 2 is a partial rear plan view of the solar cell illustrated in FIG. 1.

Referring to FIGS. 1 and 2, a solar cell 100 according to the embodiment of the invention includes a semiconductor substrate 10 including a base region 110, a tunneling layer 20 on the semiconductor substrate 10, a semiconductor layer 30 including conductive type regions 32 and 34 on the tunneling layer 20, and electrodes 42 and 44 connected to the conductive type regions 32 and 34. In this instance, the semiconductor layer 30 may include a first conductive type region 32, a second conductive type region 34, and a barrier region 36. The first conductive type region 32 has a first conductive type, and the second conductive type region 34 has a second conductive type. The barrier region 36 may be positioned between the first conductive type region 32 and the second conductive type region 34, and the barrier region 36 is intrinsic. The electrodes 42 and 44 may include a first electrode 42 connected to the first conductive type region 32 and a second electrode 44 connected to the second conductive type region 34. The solar cell 100 may further include a passivation layer 24, an anti-reflective layer 26, an insulating layer 40 and the like. This will be described in more detail.

The semiconductor substrate 10 may include the base region 110 including the second conductive type dopant (of dopants) at a relatively low doping concentration to have the second conductive type. The base region 110 may include a crystalline semiconductor including the second conductive type dopant. For example, the base region 110 may include a single-crystalline or a polycrystalline semiconductor (for example, a single-crystalline or a polycrystalline silicon) including the second conductive type dopant. Particularly, the base region 110 may be a single-crystalline semiconductor (e.g., a single-crystalline wafer, more particularly, a single-crystalline silicon wafer) including the second conductive type dopant. When the base region 110 includes the single-crystalline silicon, the solar cell 100 is a single-crystalline silicon solar cell. The solar cell 100 is based on the base region 110 or the semiconductor substrate 10 including the single-crystalline silicon with a high degree of crystallinity and a low degree of defects, and thus, the solar cell 100 has an enhanced electrical property.

The second conductive type dopant may be of an n-type or a p-type. For example, when the base region 110 is of an n-type, the first conductive type region 32 of a p-type to form a junction (e.g., a pn junction with the tunneling layer 20 disposed therebetween) that forms carriers by photoelectric conversion with the base region 110 has a wide area and thus a photoelectric conversion area may be increased. In addition, in this instance, the first conductive type region 32 having a wide area effectively collects holes having a relatively slow movement rate and thus may further contribute to improvement in a photoelectric conversion efficiency. However, the embodiment of the invention is not limited to the above examples.

In addition, the semiconductor substrate 10 may include a front surface field region 130 at a front surface thereof. The front surface field region 130 may have the same conductive type as that of the base region 110 and a higher doping concentration than the base region 110.

In the embodiment of the invention, the front surface field region 130 is a doping region formed by doping the semiconductor substrate 10 with a second conductive type dopant at a relatively high doping concentration. Accordingly, the front surface field region 130 constitutes the semiconductor substrate 10, including a crystalline (single-crystalline or polycrystalline) semiconductor of the second conductive type. For example, the front surface field region 130 may be formed as a portion of a single-crystalline semiconductor substrate (e.g., a single-crystalline silicon wafer substrate) of a second conductive type. However, the embodiment of the invention is not limited to the above examples. Thus, the front surface field region 130 may be formed by doping a separate semiconductor layer from the semiconductor substrate 10 (e.g., an amorphous semiconductor layer, a microcrystalline semiconductor layer, or a polycrystalline semiconductor layer) with a second conductive type dopant. In another embodiment of the invention, the front surface field region 130 may be a field region that acts similarly to a region formed through doping by fixed charges of a layer (e.g., the passivation layer 24 and/or the anti-reflective layer 26) formed adjacent to the semiconductor substrate 10. For example, when the base region 110 is the n-type, the passivation layer 24 may include an oxide having fixed negative charge (for example, an aluminum oxide) to form an inversion layer at the surface of the base region 110. The inversion layer may be used as the field region. In this instance, the semiconductor substrate 10 does not include an additional doping region and consists of the base region 110, and thus, the defect of the semiconductor substrate 10 can be minimized. The front surface field region 130 having various structures may be formed using various other methods.

In the embodiment of the invention, the front surface of the semiconductor substrate 10 may be textured to have an uneven surface (or protruded portions and/or depressed portions) in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cell 100 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cell 100 may be enhanced. However, the embodiment of the invention is not limited to the above example. In some instances, an uneven portion may be formed at the back surface of the semiconductor substrate 10 by texturing. In addition, various modifications are possible.

The tunneling layer 20 is formed on the back surface of the semiconductor substrate 10 between the semiconductor substrate 10 and the conductive type regions 32 and 34. Interface properties of the back surface of the semiconductor substrate 10 may be enhanced by the tunneling layer 20, and the tunneling layer 20 enables carriers generated by photoelectric conversion to be smoothly transferred by tunneling effects. The tunneling layer 20 may include various materials enabling carriers to tunnel therethrough, e.g., an oxide. For example, the tunneling layer 20 may be a thermal oxide layer including a silicon oxide and so on. In this regard, the tunneling layer 20 may be formed over the entire back surface of the semiconductor substrate 10. Accordingly, the tunneling layer 20 may completely passivate the back surface of the semiconductor substrate 10 and be easily formed without separate patterning.

The tunneling layer 20 may have a thickness T1 that is smaller than each of thicknesses of the semiconductor layer 30 and the insulating layer 40. In the embodiment of the invention, the tunneling layer 20 is formed under a temperature higher than room temperature and a pressure lower than atmospheric pressure, and thus, the tunneling layer 20 is uniformly formed to have a small thickness. For example, the thickness T1 of the tunneling layer 20 may be about 2 nm or less (for example, 1.0 nm to 1.5 nm). When the thickness T1 of the tunneling layer 20 has the small thickness of about 2 nm or less, a tunneling probability of the carrier can be increased and a fill factor FF of the solar cell 100 can be enhanced. Particularly, when the thickness T1 of the tunneling layer 20 is about 1.5 nm or less (particularly, about 1.4 nm or less, and, more particularly, about 1.3 nm or less), the fill factor of the solar cell 100 can be further enhanced. However, when the thickness T1 of the tunneling layer 20 is less than 1.0 nm, it may be difficult to form the tunneling layer 20 uniformly. Also, the dopants of the semiconductor layer 30 may be diffused into the semiconductor substrate 10 by penetrating the tunneling layer 20 and the recombination may be induced. Further, the passivation property of the tunneling layer 20 may be reduced because the tunneling layer 20 is affected from the crystalline property of the semiconductor substrate 10. Thus, an implied open-circuit voltage may be reduced.

A manufacturing method of the tunneling layer 20 and the thickness T1 of the tunneling layer 20 will be described in more detail. However, the invention is not limited thereto, and thus, the tunneling layer 20 may have the thickness T1 different from the above.

The semiconductor layer 30 including the conductive type regions 32 and 34 and the barrier region 36 may be disposed on the tunneling layer 20. The conductive type regions 32 and 34 of the semiconductor layer 30 may include a semiconductor (for example, silicon) including the first or second conductive type dopants. The barrier region 36 may include a semiconductor (for example, silicon) not including the first and second conductive type dopants.

More particularly, the conductive type regions 32 and 34 may include the first conductive type region 32 including the first conductive type dopant thus having the first conductive type, and the second conductive type region 34 including the second conductive type dopant thus having the second conductive type. The barrier region 36 that is intrinsic may be disposed between the first and second conductive type regions 32 and 34.

The first conductive type region 32, which is a part of the semiconductor layer 30, forms a pn junction (or pn tunnel junction) with the base region 110 while disposing the tunneling layer 20 therebetween and thus constitutes an emitter region that generates carriers by photoelectric conversion. In this regard, the first conductive type region 32 may include a semiconductor (e.g., silicon) including the first conductive type dopant opposite to the base region 110. The first conductive type dopant may be included in the semiconductor layer 30 when forming the semiconductor layer 30 or may be included in the semiconductor layer 30 by various doping methods such as thermal diffusion, ion implantation, and the like after forming the semiconductor layer 30.

In this regard, the first conductive type dopant may be any dopant having a conductive type opposite to the base region 110. That is, when the first conductive type dopant is of a p-type, the first conductive type dopant may be a Group III element such as B, Al, Ga, In, or the like. When the first conductive type dopant is of an n-type, the first conductive type dopant may be a Group V element such as P, As, Bi, Sb, or the like.

The second conductive type region 34, which is a part of the semiconductor layer 30, forms a back surface field and thus forms a back surface field region that prevents loss of carriers by recombination at a surface (more particularly, the back surface) of the semiconductor substrate 10.

The second conductive type region 34 may include a semiconductor (e.g., silicon) including the same second conductive type dopant as that of the base region 110. The second conductive type dopant may be included in the semiconductor layer 30 when forming the semiconductor layer 30 or may be included in the semiconductor layer 30 by various doping methods such as thermal diffusion, ion implantation, and the like after forming the semiconductor layer.

In this regard, the second conductive type dopant may be any dopant having the same conductive type as that of the base region 110. That is, when the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like.

In this regard, the second conductive type region 34 having the same conductive type as that of the base region 110 may have a narrower area than that of the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are n-type conductive and the first conductive type region 32 is p-type conductive, the first conductive type region 32 having a wide area may effectively collect holes having a relatively slow movement rate. The planar structure of the first and second conductive type regions 32 and 34 and the barrier region 36 will be described below in further detail with reference to FIG. 2.

It is exemplified that the barrier region 36 is entirely separate the first conductive type region 32 and the second conductive type region 34 from each other in the embodiment of the invention. However, the embodiment of the invention is not limited thereto. Thus, the barrier region 36 may be a separate part of a boundary portion between the first conductive type region 32 and the second conductive type region 34. In this instance, at the other part of the boundary portion between the first conductive type region 32 and the second conductive type region 34, the first conductive type region 32 and the second conductive type region 34 may be in contact with each other. Also, the barrier region 36 may be not included, and thus, all the boundary portion between the first conductive type region 32 and the second conductive type region 34 may be in contact with each other. Various modifications are possible.

In the embodiment of the invention, the first and second conductive type regions 32 and 34 and the barrier region 36 may be formed of a continuous single semiconductor layer 30 disposed on the same surface (for example, the back surface) of the semiconductor substrate 10. Thus, the first and second conductive type regions 32 and 34 and the barrier region 36 may be disposed on the same plane and may have substantially the same thickness. For example, when a semiconductor layer 30 including a semiconductor material is formed, a portion of the semiconductor layer 30 is doped with a first conductive type dopant to form a first conductive type region 32 and another portion of the semiconductor layer 30 is doped with a second conductive type dopant to form a second conductive type region 34. Then, a portion of the semiconductor layer 30 where the first and second conductive type regions 32 and 34 are not formed constitutes the barrier region 36. Thereby, the method for manufacturing the first and second conductive type regions 32 and 34 and the barrier region 36 can be simplified.

However, the embodiment of the invention is not limited thereto. Thus, only one of the first conductive type region 32 and the second conductive type region 34 may be formed at the semiconductor layer 30 disposed on the back surface of the semiconductor substrate 10, and the other one of the first conductive type region 32 and the second conductive type region 34 may be inside the semiconductor substrate 10 to form a part of the semiconductor substrate 10. This embodiment of the invention will be described with reference to FIGS. 4a to 4h. Also, only one of the first conductive type region 32 and the second conductive type region 34 may be formed at the semiconductor layer 30 disposed on the back surface of the semiconductor substrate 10, and the other one of the first conductive type region 32 and the second conductive type region 34 may be formed at another semiconductor layer disposed on the front surface of the semiconductor substrate 10. In this instance, another tunneling layer, another semiconductor layer, and another insulating layer may be formed on the front surface of the semiconductor substrate 10. Accordingly, the descriptions for the conductive type regions 32 and 34, the electrodes 42 and 44, and the insulating layer 40 in the above may be applied to the first conductive type region 32, the first electrode 42, and the insulating layer 40 or may be applied to the second conductive type region 34, the second electrode 44, and the insulating layer 40. Other modifications are possible.

An insulating layer 40 may be formed on the semiconductor layer 40. The insulating layer 40 includes a first opening (or first openings) 402 to connect the first conductive type region 32 and the first electrode 42 and a second opening (second openings) 404 to connect the second conductive type region 34 and the second electrode 44. Thereby, the insulating layer 40 may prevent electrodes to which the first and second conductive type regions 32 and 34 must not be connected (i.e., the second electrode 44 for the first conductive type region 32 and the first electrode 42 for the second conductive type region 34) from being connected to each other. In addition, the insulating layer 40 can passivate the semiconductor layer 30.

The insulating layer 40 may be disposed on a portion of the semiconductor layer 30 where the electrodes 42 and 44 are not formed. The insulating layer 40 has a thickness larger than the tunneling layer 20. Then, the insulating property and the passivation property of the insulating layer 40 can be enhanced.

For example, the insulating layer 40 may include various insulating materials (for example, an oxide, a nitride, and so on). For example, the insulating layer 40 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. However, the embodiment of the invention is not limited thereto, and thus, the insulating layer 40 may include one or more of various materials.

In this regard, the first electrode 42 passes through the first opening 402 of the insulating layer 40 and is connected to the first conductive type area 32, and the second electrode 44 passes through the second opening 404 of the insulating layer 40 and is connected to the second conductive type area 34. The first and second electrodes 42 and 44 may include one or more of a variety of metal materials. In addition, the first and second electrodes 42 and 44 may have a variety of plane shapes which are not electrically connected to each other and are connected to the first conductive type area 32 and the second conductive type area 34, respectively, to collect produced carriers and transport the same to the outside. That is, the invention is not limited to the plane shapes of the first and second electrodes 42 and 44.

Hereafter, planar shapes of the first and second conductive type regions 32 and 34, the barrier region 36, and the first and second electrodes 42 and 44 will be described in detail with reference to FIGS. 1 and 2.

Referring to FIG. 1 and FIG. 2, in the embodiment of the invention, the first and second conductive type regions 32 and 34 are extended so as to have a stripe shape and alternately disposed with respect to each other in a direction crossing a longitudinal direction. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples.

In this regard, the first conductive type region 32 may have a wider area than the second conductive type region 34. For example, the areas of the first and second conductive type regions 32 and 34 may be adjusted by differently adjusting widths thereof. That is, a width W1 of the first conductive type region 32 may be greater than a width W2 of the second conductive type region 34. Thereby, the first conductive type region 32 constituting the emitter region has a wide area, and thus, a photoelectric conversion area may be increased. In this regard, when the first conductive type region 32 is p-type conductive, the first conductive type region 32 having a wide area may effectively collect holes having a relatively slow movement rate.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 may be formed to respectively correspond to total lengths of the first and second electrodes 42 and 44. Thus, a contact area between the first electrode 42 and the first conductive type region 32 and a contact area between the second electrode 44 and the second conductive type region 34 are maximized and, accordingly, a carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 1, the passivation layer 24 and/or the anti-reflective layer 26 may be disposed on the front surface of the semiconductor substrate 10 (more particularly, the front surface field region 130 formed at the front surface of the semiconductor substrate 10). According to embodiments of the invention, only the passivation layer 24 may be formed on the semiconductor substrate 10, only the anti-reflective layer 26 may be formed on the semiconductor substrate 10, or the passivation layer 24 and the anti-reflective layer 26 may be sequentially disposed on the semiconductor substrate 10. FIG. 1 illustrates an instance in which the passivation layer 24 and the anti-reflective layer 26 are sequentially formed on the semiconductor substrate 10 and the semiconductor substrate 10 contacts the passivation layer 24. However, the embodiment of the invention is not limited to the above examples, and the semiconductor substrate 10 may contact the anti-reflective layer 26. In addition, various modifications are possible.

The passivation layer 24 and the anti-reflective layer 26 may be substantially entirely formed on the front surface of the semiconductor substrate 10. In this regard, the expression "entirely formed" as used herein includes an instance in which the passivation layer 24 and the anti-reflective layer 26 are physically completely formed and an instance in which the passivation layer 24 and the anti-reflective layer 26 are incompletely formed by an unavoidable reason.

The passivation layer 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage of the solar cell 100 may be increased. Also, by the anti-reflection layer 26, the amount of light reaching a pn junction formed at an interface between the base region 110 and the first conductive type region 32 may be increased by reducing the reflectance of light incident upon the front surface of the semiconductor substrate 10. Accordingly, a short-circuit current Isc of the solar cell 100 can be increased. As such, the open circuit voltage and the short-circuit current Isc of the solar cell 100 can be increased by the passivation layer 24 and the anti-reflective layer 26 and, accordingly, the efficiency of the solar cell 100 can be enhanced.

The passivation layer 24 and/or the anti-reflective layer 26 may be formed of various materials. For example, the passivation layer 24 and/or the anti-reflection layer 26 may be any one layer selected from the group consisting of a silicon nitride layer, a hydrogen-containing silicon nitride layer, a silicon oxide layer, a silicon oxynitride layer, an aluminum oxide layer, a $MgF_2$ layer, a ZnS layer, a $TiO_2$ layer, and a $CeO_2$ layer or have a multilayer structure including two or more of the above-listed layers in combination. For example, the passivation layer 24 may include silicon oxide, and the anti-reflective layer 26 may include silicon nitride.

When light is incident upon the solar cell 100 according to the embodiment of the invention, electrons and holes are generated by photoelectric conversion at the pn junction formed between the base region 110 and the first conductive type region 32, and the generated holes and electrons tunnel by tunneling through the tunneling layer 20, respectively move to the first and second conductive type regions 32 and 34 and then respectively migrate to the first and second electrodes 42 and 44. Electric energy is generated thereby.

As in the embodiment of the invention, in the solar cell 100 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 can be minimized. Accordingly, efficiency of the solar cell 100 can be enhanced. However, the embodiment of the invention is not limited to the above examples.

Hereinafter, the manufacturing method of the solar cell 100 having the above structure will be described in detail with reference to FIGS. 3a to 3g. FIGS. 3a to 3g are sectional views illustrating a method for manufacturing a solar cell according to an embodiment of the invention.

Figure 3A:
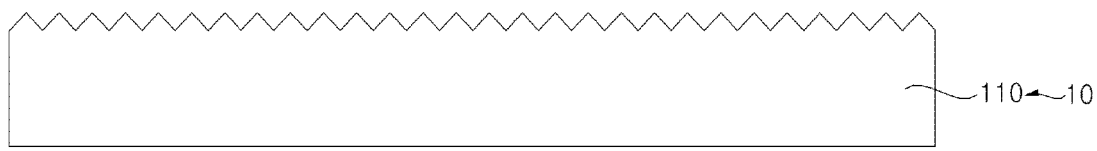
FIGS. 3a to 3g are sectional views illustrating a method for manufacturing a solar cell according to an embodiment of the invention.

First, as shown in FIG. 3a, a semiconductor substrate 10 including a base region 110 having a second conductive type dopant is prepared. In the embodiment of the invention, the semiconductor substrate 10 may be a silicon substrate (for example, a silicon wafer) having an n-type dopant. Examples of the n-type dopant include, but are not limited to, Group V elements such as phosphorous (P), arsenic (As), bismuth (Bi) and antimony (Sb). However, the embodiment of the invention is not limited thereto, and the base region 110 may have a p-type dopant.

At least one of the front and back surfaces of the semiconductor substrate 10 is textured so that the surface is an uneven surface (or have protruded portions and/or depressed portions). A wet or dry texturing method may be used as the texturing of the surface of the semiconductor substrate 10. A wet texturing may be carried out by dipping the semiconductor substrate 10 in a texturing solution and has an advantage of a short process time. A dry texturing is a process of cutting the surface of the semiconductor substrate 10 using a diamond drill, laser or the like and enables formation of uniform protruded portions and/or depressed portions, but disadvantageously has long process time and causes damage to the semiconductor substrate 10. Alternatively, the semiconductor substrate 10 may be textured by reactive ion etching (RIE) or the like. As such, the semiconductor substrate 10 may be textured by a variety of methods.

For example, the front surface of the semiconductor substrate 10 may be textured to have the protruded portions and/or depressed portions or to be uneven surface. Meanwhile, the back surface of the semiconductor substrate 10 may be a relatively smooth and even surface formed by mirror polishing or the like and having a lower surface roughness than the front surface of the semiconductor substrate 10. However, the embodiment of the invention is not limited thereto, and thus, the semiconductor substrate 10 having various structures may be used.

Figure 3B:
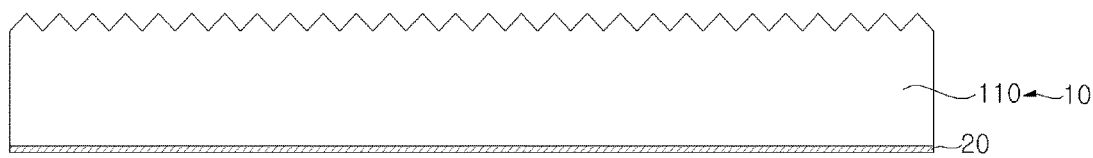

Next, as shown in FIG. 3b, a tunneling layer 20 is formed on the back surface of the semiconductor substrate 10. The tunneling layer 20 may be entirely formed on the back surface of the semiconductor substrate 10.

In the embodiment of the invention, the tunneling layer 20 may be formed under a temperature higher than room temperature, a pressure lower than atmospheric pressure, and an atmosphere including a raw gas. In embodiments of the invention, reference to the room temperature means a temperature between about 20° C. and about 26° C., but may be other temperatures. The raw gas may include an oxygen gas and the tunneling layer 20 may be formed of an oxide layer. More particularly, the tunneling layer 20 may be formed of a thermal oxidation layer (for example, a thermal silicon oxide layer) formed by a reaction between the semiconductor material (for example, silicon) of the semiconductor substrate 10 and an oxygen at a high temperature.

Thus, in the embodiment of the invention, the raw gas does not include all raw materials constituting the tunneling layer 20. That is, the raw gas just includes the oxygen among the oxide constituting the tunneling layer 20 and does not include the other of the raw materials of the tunneling layer 20. For example, when the tunneling layer 20 includes the silicon oxide, oxygen is included in the raw gas and the silicon that is the other raw material is not included in the raw gas. Accordingly, the tunneling layer 20 is formed by a thermal oxidation process. In the thermal oxidation process, the oxygen in the oxygen gas is diffused into an inside of the semiconductor substrate 10 and is reacted with the semiconductor material of the semiconductor substrate 10. Unlike the thermal oxidation process, silane ($SiH_4$) gas including silicon, along with the oxygen gas including oxide, is provided as the raw gas in a deposition process. In the deposition process, the oxygen separated from the oxygen gas and the silicon separated from the silane gas by a pyrolysis process are chemically reacted to each other, thereby forming a silicon oxide.

The atmosphere during the forming of the tunneling layer 20 may include one or more of various materials besides the oxygen gas that is the raw gas. For example, the atmosphere may further include a nitrogen gas and a chlorine gas. The chlorine gas adsorbs impurity particles during the thermal oxidation process, and increases a purity of the tunneling layer 20. The nitrogen gas relates to a growth rate of the tunneling layer 20, and the nitrogen gas relates to a uniformity of the tunneling layer 20 relevant to a leakage current and a dopant penetration.

In this instance, since the chlorine gas may increase the growth rate of the tunneling layer 20, an amount of the chlorine gas may be smaller than an amount of the oxygen gas. For example, a volume ratio of the oxygen gas:the chlorine gas may be about 1:0.05 to about 1:0.1. When the volume ratio is below about 1:0.05, the effect of the chlorine gas for increasing the purity may be not sufficient. When the volume ratio is above about 1:0.1, although the chlorine gas is included by an amount more than the necessary amount, the purity of the tunneling layer 20 may be reduced unlike expectations, and a thickness of the tunneling layer 20 may increase due to the large growth rate of the tunneling layer 20. However, the invention is not limited thereto, and thus, various modifications are possible. An amount of the nitrogen gas may be adjusted in consideration of a size of a chamber where the tunneling layer 20 is formed. A total amount of the oxygen gas, the chlorine gas, and the nitrogen gas may be adjusted to have the predetermined pressure.

When the tunneling layer 20 is formed by the thermal oxidation process at a high temperature as in the above, the tunneling layer 20 may be easily thickened. Thus, in the embodiment of the invention, the tunneling layer 20 is formed under a pressure lower than an atmospheric pressure. Then, the quick increase of the thickness of the tunneling layer 20 can be prevented (that is, the growth rate of the tunneling layer 20 can be controlled), and thus, the tunneling layer 20 can have total uniformity and small thickness.

More particularly, the temperature of the forming process of the tunneling layer 20 is about 600° C. or more and the pressure of the forming process of the tunneling layer 20 is about 2 Torr or less. The pressure may refer to a pressure of total gases including the raw gas and the other gases inside an apparatus for forming the tunneling layer 20.

In the embodiment of the invention, when the tunneling layer 20 is formed at a temperature of about 600° C. or more, a density of a layer of the tunneling layer 20 can be enhanced and an interface trap density (Dit) of the tunneling layer 20 can be reduced, thereby enhancing the passivation property of the tunneling layer 20. Also, the tunneling layer 20 can be formed at a temperature similar to a temperature of a forming process of the semiconductor layer 30 that will be formed after the tunneling layer 20. Thus, the tunneling layer 20 and the semiconductor layer 30 can be formed by a continuous process, and this will be described in more detail.

In this instance, when the pressure is maintained to a pressure of about 2 Torr or less, the growth rate of the tunneling layer 20 can be maintained to be low by the low pressure although the tunneling layer 20 is formed at the high temperature by the thermal oxidation process. Thereby, the thickness of the tunneling layer 20 can be largely reduced.

More particularly, the temperature of the forming process of the tunneling layer may be in a range from about 600° C. to about 800° C. and the pressure of the forming process of the tunneling layer 20 may be in a range from about 0.01 Torr to about 2 Torr. When the temperature of the forming process of the tunneling layer 20 is above about 800° C., controlling the thickness of the tunneling layer 20 may be difficult and variations of the thickness of the tunneling layer 20 may be large even if the pressure is low. In order to effectively control the thickness of the tunneling layer 20, the temperature of the forming process of the tunneling layer may be in a range from about 600° C. to about 700° C. When the pressure of the forming process of the tunneling layer 20 is below about 0.1 Torr, it may be expensive and may be burden on the apparatus for manufacturing the tunneling layer 20. However, the embodiment of the invention is not limited thereto, and thus, the temperature and the pressure of the forming process of the tunneling layer 20 may be varied.

The forming process of the tunneling layer 20 may be performed for about 5 minutes to about 30 minutes. When the time is below about 5 minutes, the tunneling layer 20 may be difficult to have the wanted thickness, and the thickness uniformity of the tunneling layer 20 may be low. When the time is above about 30 minutes, the tunneling layer 20 may have a thickness larger than the wanted thickness, and the process time may increase. In order to uniformly form the tunneling layer 20 with the wanted thickness, the process time may be in a range from about 10 minutes to about 20 minutes. However, the embodiment of the invention is not limited thereto, and thus, the process time may be varied.

For example, the thickness of the tunneling layer 20 may be about 2 nm or less in the embodiment of the invention. When the tunneling layer 20 is thin as in the above, the tunneling probability of the carrier can be increased and the fill factor of the solar cell 100 can be enhanced. More particularly, the thickness of the tunneling layer 20 may be about 1.5 nm or less (for example, about 1.0 nm to 1.5 nm). When the thickness of tunneling layer 20 may be about 1.5 or less, the fill factor of the solar cell 100 can be further enhanced. In this instance, when the thickness of the tunneling layer 20 may be about 1.4 nm or less (for example, about 1.3 nm or less), the fill factor of the solar cell 100 can be largely enhanced. When the thickness of the tunneling layer 20 may be below 1.0 nm, the tunneling layer 20 may be not uniformly formed and the effect of the tunneling layer 20 may be not sufficient. However, the embodiment of the invention is not limited thereto, and thus, the thickness of the tunneling layer 20 may be varied.

On the other hand, a thin oxide layer where the tunneling is possible, like the tunneling layer 20 of the solar cell 100, is not necessary in the conventional semiconductor device field and so on. That is, in the conventional semiconductor device field and so on, a thickness of the oxide layer is controlled in a range that the tunneling is not generated, and there is no need to form the thin oxide layer where the tunneling is possible. Also, it is not known that the thickness of the tunneling layer can be adjusted by controlling both of the temperature and the pressure. Accordingly, in the conventional solar cell, the tunneling layer is formed by intactly using a wet oxidation, a thermal oxide in a furnace of an atmospheric pressure, and so on that are generally used in the conventional semiconductor device field.

On the other, in the embodiment of the invention, the tunneling layer 20 is formed by using the thermal oxidation process performed at the high temperature as in the above. Contrary to the conventional art, a rate of the thermal oxidation is controlled by the pressure lower than the atmospheric atmosphere in the embodiment of the invention. Thereby, the tunneling layer 20 can be formed to be thin and be uniform so that the tunneling can be smoothly induced.

According to the embodiment of the invention, both of the temperature and the pressure should be controlled to form the tunneling layer 20. Thus, the tunneling layer 20 cannot be formed by using the conventional furnace that the pressure control is not possible. In the embodiment of the invention, the tunneling layer 20 is formed by using an apparatus where both of the pressure and the temperature can be controlled. Accordingly, in the embodiment of the invention, the tunneling layer 20 may be formed by the thermal oxidation process at a deposition apparatus. Since the low pressure is necessary, the tunneling layer 20 may be formed at a low pressure chemical vapor deposition apparatus.

A semiconductor layer 30 (in FIG. 3c) that will be formed on the tunneling layer 20 is formed at a deposition apparatus. Thus, when the tunneling layer 20 is formed at a deposition apparatus, the tunneling layer 20 and the semiconductor layer 30 can be formed by an in-situ process continuously (or sequentially) performed in the same apparatus (more particularly, the low pressure chemical vapor deposition apparatus). When the tunneling layer 20 and the semiconductor layer 30 are formed by the in-situ process, the manufacturing process can be largely simplified and the manufacturing cost and the manufacturing time can be largely reduced.

The temperature inside the deposition apparatus is adjusted by heating or cooling for a long time, and thus, a lot of time is necessary to stabilize the temperature. On the other hand, the atmosphere and the pressure can be adjusted according to a kind and an amount of a gas. Therefore, the atmosphere and the pressure can be easily controlled, compared with the temperature.

Considering this, in the embodiment of the invention, the temperature difference between the temperature of forming the tunneling layer 20 and the temperature of forming the semiconductor layer 30 may be in a range of about 200° C. or less (that is, about 0° C. to about 200° C.). More particularly, the temperature difference between the temperature of forming the tunneling layer 20 and the temperature of forming the semiconductor layer 30 may be in a range of about 100° C. or less (that is, about 0° C. to about 100° C.). This is because the temperature difference between the temperature of forming the tunneling layer 20 and the temperature of forming the semiconductor layer 30 can be reduced since the temperature of forming the tunneling layer 20 can be relatively increased due to the low pressure of the forming the tunneling layer 20. In the embodiment of the invention, the temperature that cannot be easily adjusted can be maintained without a big change, and therefore, the efficiency of the in-situ process for continuously forming the tunneling layer 20 and the semiconductor layer 30 can be further enhanced. On the other hand, the atmosphere of the deposition process of the semiconductor layer 30 may be different from the atmosphere of the deposition process of the tunneling layer 20, and the pressure of the deposition process of the semiconductor layer 30 may be the same as or different from the pressure of the deposition process of the tunneling layer 20. This will be described in more detail when the deposition process of the semiconductor layer 30 will be described.

Figure 3C:
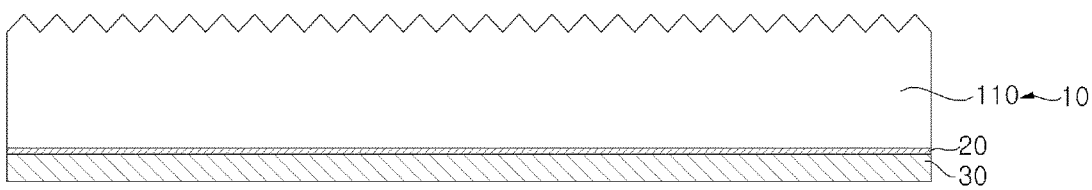
Figure 3D:
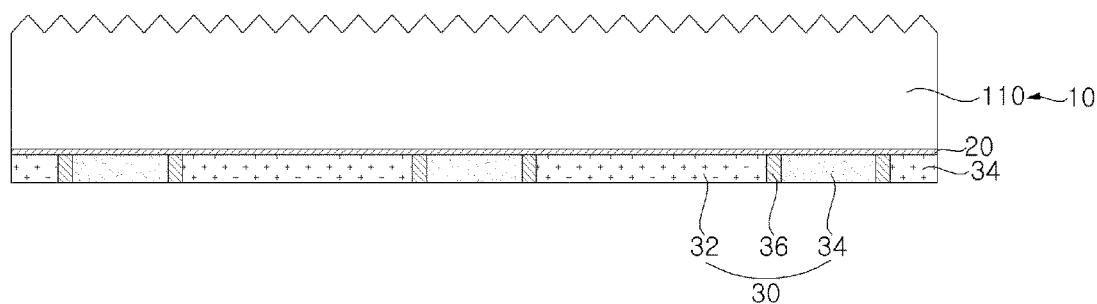

Then, as shown in FIGS. 3c and 3d, the semiconductor layer 30 is formed on the tunneling layer 20. This will be described in more detail.

As shown in FIG. 3c, the semiconductor layer 30 that is intrinsic and does not have dopants is formed on the tunneling layer 20 by a deposition process for depositing a semiconductor material.

In the embodiment of the invention, the semiconductor layer 30 being intrinsic may be formed by a chemical vapor deposition. More particularly, the semiconductor layer 30 may be formed by a low pressure chemical vapor deposition. Accordingly, as described in the above, the semiconductor layer 30 being intrinsic and the tunneling layer 20 may be formed by an in-situ process. However, the embodiment of the invention is not limited thereto, and the in-situ process is not applied to form the tunneling layer 20 and the semiconductor layer 30.

A gas used for the deposition process of the semiconductor layer 30 may include a gas having a semiconductor material constituting the semiconductor layer 30. For example, the gas may be a silane gas. In the embodiment of the invention, the semiconductor layer 30 being intrinsic is deposited, and thus, the atmosphere may include the gas having the semiconductor material only. Then, the supplied gas can be simplified, and a purity of the semiconductor layer 30 can be enhanced. However, the embodiment of the invention is not limited thereto. Thus, additional gases for accelerating the deposition process of the semiconductor layer 30 or for enhancing properties of the semiconductor layer 30 may be additionally used. Also, when doping of the first and/or second conductive type dopants is performed during the deposition process of the semiconductor layer 30, a gas including the first or second conductive type dopant (for example, $B_2H_6$, $PH_3$, and so on) may be further included. This will be described in more detail with reference to FIGS. 4a to 4h.

Also, in the deposition process of the semiconductor layer 30, a nitrous oxide ($N_2O$) gas and/or an oxygen ($O_2$) gas may be supplied along with the gas having the semiconductor material in order to control a size of grains, crystallinity, and so on.

The deposition temperature of the semiconductor layer 30 may be the same as or lower than of the temperature for forming the tunneling layer 20. Particularly, when the temperature for forming the semiconductor layer 30 is smaller than the temperature for forming the tunneling layer 20, properties of the semiconductor layer 30 directly related to photoelectric conversion can be uniform. Selectively, the deposition temperature of the semiconductor layer 30 may be in a range from about 500° C. to about 700° C. The temperature range may be appropriate to deposit the semiconductor layer 30 having a different crystal structure from the semiconductor substrate 10. Particularly, when the semiconductor layer 30 is not doped with dopants as in the embodiment of the invention, a reaction rate is small compared with a doped semiconductor layer. Thus, the deposition temperature of the semiconductor layer 30 may be in a range from about 600° C. to about 700° C. Hereby, the temperature difference between the deposition temperature of the semiconductor layer 30 and the forming temperature of the tunneling layer 20 can be reduced more.

As stated in the above, the temperature for forming the tunneling layer 20 is the same as or similar to the temperature for forming the semiconductor layer 30, and thus, time for controlling the temperature and time for stabilizing the temperature may be not necessary or may be reduced. Accordingly, the process can be simplified.

Also, the deposition pressure of the semiconductor layer 30 may be in a range from about 0.01 Torr to about 0.5 Torr. When the deposition pressure is maintained below about 0.01 Torr, there may be a process limit and the process time of the semiconductor layer 30 may increase, and thus, such deposition pressure may be difficult to be applied to an actual mass-produce process. When the deposition pressure is above about 0.5 Torr, the uniformity of the semiconductor layer 30 may be reduced. Selectively, the deposition pressure of the semiconductor layer 30 may be the same as or smaller than that of the tunneling layer 20. Particularly, when the deposition pressure of the semiconductor layer 30 is smaller than that of the tunneling layer 20, the properties of the semiconductor layer 30 directly related to photoelectric conversion can be uniform.

This will be described in more detail. The gas including the semiconductor material (for example, silicon) is pyrolyzed, and the semiconductor material is deposited on the tunneling layer 20, thereby forming the semiconductor layer 30. If the temperature and/or the pressure increase in order to increase the growth rate, the variation of the crystalline property of the semiconductor layer 30 increases. The moving velocity of the carrier is related to the crystalline property of the semiconductor layer 30. When the variation of the crystalline property of the semiconductor layer 30 increases, the property of the semiconductor layer 30 may be non-uniform. On the other hand, the tunneling layer 20 is very thin, and the crystalline property of the tunneling layer 20 does not largely affect the property of the tunneling layer 20. Considering this, the deposition temperature and/or the deposition pressure of the semiconductor layer may be lower than the temperature and/or the pressure for forming the tunneling layer 20 in order to enhance the property of the semiconductor layer 30, although the semiconductor layer 30 is thicker than the tunneling layer 20.

However, the embodiment of the invention is not limited thereto. The atmosphere, the temperature, and the pressure of the deposition process of the semiconductor layer 30 may be varied.

The semiconductor layer 30 may be formed by changing the kind of the gas and controlling the amount of the gas after forming the tunneling layer 20. For example, after forming the tunneling layer 20, the gas used for forming the tunneling layer 20 (for example, the oxygen gas, the nitrogen gas, the chlorine gas, and so on) is removed by a pumping and a purge, and then, the gas for forming the semiconductor layer 30 (for example, the gas including the semiconductor material) is supplied to form the semiconductor layer 30.

Accordingly, the forming process of the tunneling layer 20 and the semiconductor layer 30 can be simplified. In the conventional method, the semiconductor substrate having the tunneling layer is pulled out to the outside of an apparatus after forming the tunneling layer. Then, the tunneling layer may be polluted by impurities and the tunneling layer may be thicker due to an additional oxidation. On the other hand, in the embodiment of the invention, the semiconductor layer 30 is continuously formed at the apparatus of forming the tunneling layer 20 and the tunneling layer 20 is not exposed to the outside before forming the semiconductor layer 30. Therefore, the problems that may be generated when the tunneling layer 20 is exposed to the outside before forming the semiconductor layer 30 can be prevented or reduced.

Next, as shown in FIG. 3d, the semiconductor layer 30 including a first conductive type region 32, a second conductive type region 34, and a barrier region 36 are formed by doping first and second conductive type dopants to the semiconductor layer 30 being intrinsic. For example, a region of the semiconductor layer 30 is doped with a first conductive type dopant to form the first conductive type region 32 by various methods such as an ion implantation method, a thermal diffusion method, or a laser doping method, and another region thereof is doped with a second conductive type dopant to form the second conductive type region 34 by various methods such as an ion implantation method, a thermal diffusion method, or a laser doping method. Then, the barrier region 36 may be formed in a region of the semiconductor layer 30 between the first and second conductive type regions 32 and 34.

However, the embodiment of the invention is not limited thereto. Various methods may be used for forming the conductive type regions 32 and 34, and barrier region 36. Also, the barrier region 36 may be not formed. That is, various modifications are possible.

In the embodiment of the invention, the semiconductor layer 30 being intrinsic and not including dopants is formed on the tunneling layer 20 by the deposition process for depositing the semiconductor material, and then, the semiconductor layer 30 including the first conductive type region 32 and the second conductive type region 34, and selectively including the barrier region 36 are formed by doping first and second conductive type dopants to the semiconductor layer 30. However, the embodiment of the invention is not limited thereto. Thus, the first and/or second conductive type dopants may be doped in the deposition process for depositing the semiconductor material. This will be described in more detail with reference to FIGS. 4a to 4h.

Figure 3E:
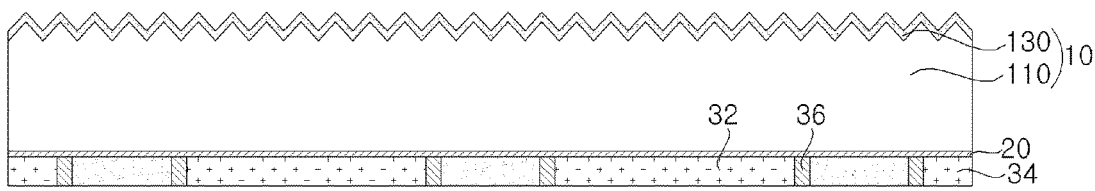

Next, as shown in FIG. 3e, a front surface field region 130 may be formed by doping the second conductive type dopant to the front surface of the semiconductor substrate 10. The front surface field region 130 may be formed by various methods, such as an ion implantation method, a thermal diffusion method, or a laser doping method. Also, the front surface field region 130 may be not additionally included.

Figure 3F:
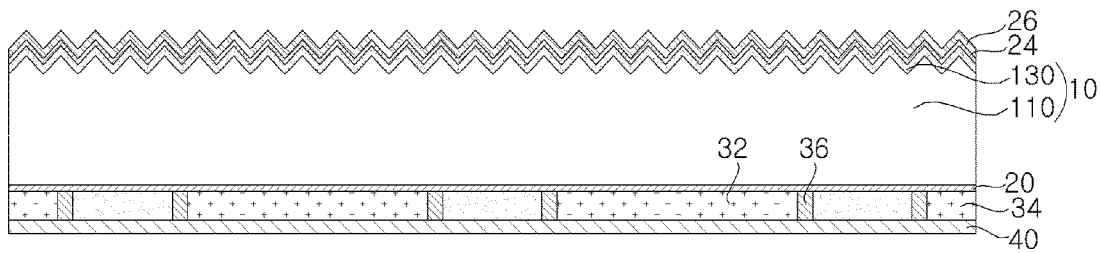

Next, as shown in FIG. 3f, a passivation layer 24 and an anti-reflective layer 26 are sequentially formed on the front surface of the semiconductor substrate 10, and an insulating layer 40 is formed on the back surface of the semiconductor substrate 10. That is, the passivation layer 24 and the anti-reflective layer 26 are formed over the entire portion of the front surface of the semiconductor substrate 10, and the insulating layer 40 are formed over the entire portion of the back surface of the semiconductor substrate 10. The passivation layer 24, the anti-reflective layer 26, and the insulating layer 40 may be formed by a variety of methods such as vacuum deposition, chemical vapor deposition, spin coating, screen printing or spray coating. A formation order of the passivation layer 24 and the anti-reflective layer 26, and the insulating layer 40 may be varied.

Figure 3G:
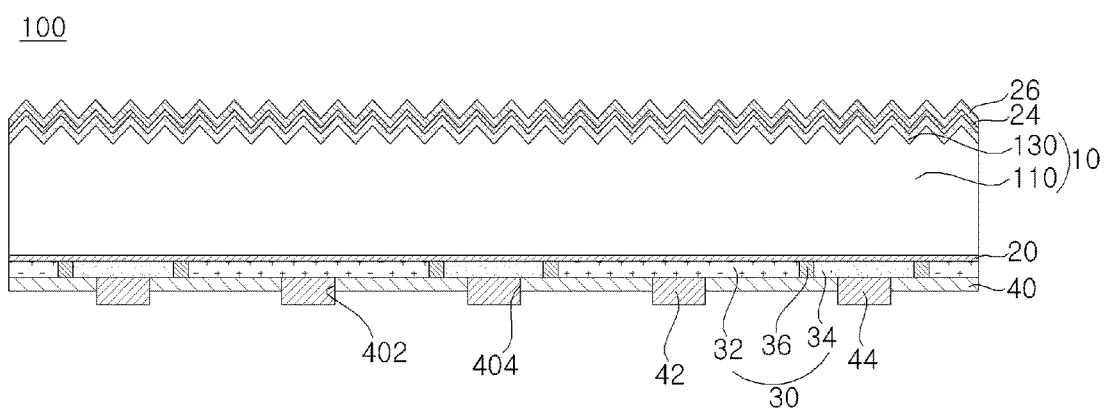

Next, as shown in FIG. 3g, the first and second electrodes 42 and 44 electrically connected respectively to the first and second conductive type regions 32 and 34 are formed.

In an embodiment of the invention, the first and second openings 402 and 404 are formed in the insulating layer 40, and the first and second electrodes 42 and 44 may be formed in the first and second openings 402 and 404 by various methods such as plating, deposition, or the like. In another embodiment of the invention, the first and second electrodes 42 and 44 having the above-described shapes may be formed by respectively applying pastes for forming first and second electrodes on the insulating layer 40 by screen-printing or the like and performing a fire through, a laser firing contact, or the like thereon. In this instance, when the first and second electrodes 42 and 44 are formed, the first and second openings 402 and 404 are formed, and thus, a separate process of forming the first and second openings 402 and 404 need not be performed.

According to the embodiment of the invention, the tunneling layer 20 is formed under the temperature higher than the room temperature and the pressure lower than the atmospheric pressure, and thus, the tunneling layer 20 can be formed to be uniform and thin. Accordingly, the tunneling probability of the tunneling layer 20 can be increased, and therefore, the properties of the solar cell 100 can be enhanced. The tunneling layer 20 can be formed at the chemical vapor deposition apparatus, and thus, the tunneling layer 20 and the semiconductor layer 30 can be formed by the in-situ process at the chemical vapor deposition apparatus. Thereby, the manufacturing process of the solar cell 100 can be simplified, and the manufacturing cost and the manufacturing time can be largely reduced.

In the embodiment of the invention, it is exemplified that the tunneling layer 20, the conductive type regions 32 and 34, and the barrier region 36 are formed, the front surface field region 130 is formed, the passivation layer 24, the anti-reflection layer 26, and the insulating layer 40 are formed, and the first and second electrodes 42 and 44 are formed. However, the embodiment of the invention is not limited thereto. Therefore, the forming sequences of the tunneling layer 20, the conductive type regions 32 and 34, the barrier region 36, the passivation layer 24, the anti-reflection layer 26, and the insulating layer 40 may be varied. Also, some of them may be not included. That is, various modifications may be possible.

Also, it is exemplified that the tunneling layer 20, the semiconductor layer 30, and so on are formed only on the back surface of the semiconductor substrate 10 in the drawings. However, the embodiment of the invention is not limited thereto. The tunneling layer 20 and the semiconductor layer 30 may be formed on the side surfaces and/or the front surface of the semiconductor substrate 10, along with the back surface of the semiconductor substrate 10. The tunneling layer and the semiconductor layer formed on the side surfaces and/or the front surface of the semiconductor substrate 10 may be removed during processes of the method for manufacturing the solar cell, or may be remained to constitute a part of the solar cell 100. For example, the tunneling layer and the semiconductor layer formed on the front surface of the semiconductor substrate 10 may be remained, and one of the first and second conductive type regions 32 and 34 may be positioned at the semiconductor layer 30 on the back surface of the semiconductor substrate 10 and the other of the first and second conductive type regions 32 and 34 may be positioned at the semiconductor layer on the front surface of the semiconductor substrate 10. Various modifications are possible.

Hereinafter, with reference to FIGS. 4a to 4h, a method for manufacturing a solar cell according to other embodiments of the invention and a solar cell manufactured by the method will be described in detail. A detailed description of the same or similar elements as those in the foregoing description will be omitted herein and a detailed description of only different elements will be provided herein. The combination of the foregoing embodiment and the modified embodiments thereof and the following embodiments and the modified embodiments thereof fall within the spirit and scope of the embodiments of the invention.

FIGS. 4a to 4h are sectional views for illustrating a method for manufacturing a solar cell according to another embodiment of the invention.

Figure 4A:
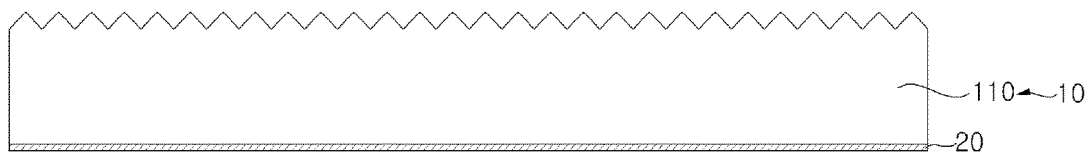
FIGS. 4a to 4h are sectional views for illustrating a method for manufacturing a solar cell according to another embodiment of the invention.

First, as shown in FIG. 4a, a tunneling layer 20 is formed on a semiconductor substrate 10.

Figure 4B:
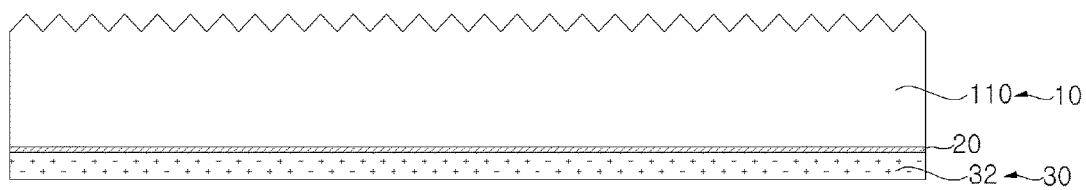
Figure 4C:
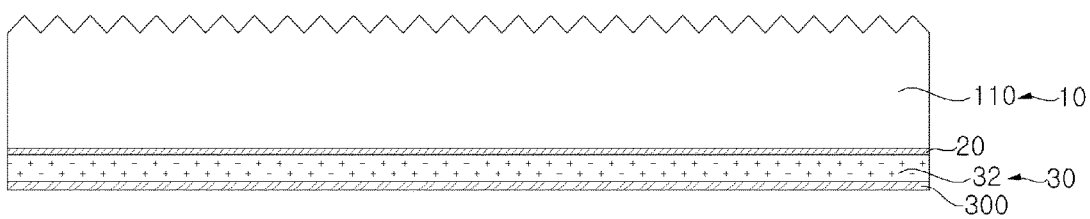
Figure 4D:
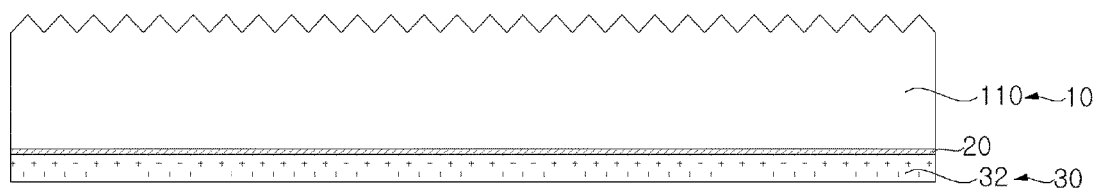

Next, as shown in FIGS. 4b to 4d, a semiconductor layer 30 is formed on the tunneling layer 20. In the embodiment of the invention, the semiconductor layer 30 is formed of a first conductive type region 32 doped with a first conductive type dopant. That is, the first conductive type region 32 may be entirely formed on the tunneling layer 20.

In the embodiment of the invention, the semiconductor layer 30 may be formed by a chemical vapor deposition, and, more particularly, by a low pressure chemical vapor deposition. Thus, the tunneling layer 20 and the semiconductor layer 30 may be formed by an in-situ process. However, the embodiment of the invention is not limited thereto. The in-situ process may be not applied to tunneling layer 20 and the semiconductor layer 30.

The gas used for the deposition process of the semiconductor layer 30 includes a gas (for example, a silane gas) including the semiconductor material constituting the semiconductor layer 30 and a gas (for example, $B_2H_6$, $PH_3$, and so on) including a first conductive type dopant. In this instance, the volume ratio of the gas including the semiconductor material:the gas including the first conductive type dopant may be in a range from about 1:0.05 to about 1:0.2. Within the range, the semiconductor layer 30 including the first conductive type dopant can stably grow. However, the embodiment of the invention is not limited thereto. The volume ratio of the gas including the semiconductor material:the gas including the first conductive type dopant may be varied.

Also, in the deposition process of the semiconductor layer 30, a nitrous oxide ($N_2O$) gas and/or an oxygen ($O_2$) gas may be supplied along with the gas having the semiconductor material in order to control a size of grains, crystallinity, and so on.

The deposition temperature of the semiconductor layer 30 may be the same as or lower than of the deposition temperature of the tunneling layer 20. Selectively, the deposition temperature of the semiconductor layer 30 may be in a range from about 500° C. to about 700° C. The temperature range may be appropriate to deposit the semiconductor layer 30 having a different crystal structure from the semiconductor substrate 10. Particularly, when the semiconductor layer 30 is formed of the first conductive type region 32 doped with the dopants as in the embodiment of the invention, a reaction rate is large. Thus, the deposition temperature of the semiconductor layer 30 may be in a range from about 500° C. to about 600° C. The deposition pressure of the semiconductor layer 30 may be in a range from about 0.01 Torr to about 0.5 Torr.

However, the embodiment of the invention is not limited thereto. The atmosphere, the temperature, and the pressure during the deposition process of the semiconductor layer 30 may be varied.

In the embodiment of the invention, the first conductive type dopant is doped to the semiconductor layer 30 in the deposition process for depositing the semiconductor layer 30, and thus, an additional doping process for doping the first conductive type dopant can be eliminated. In the embodiment of the invention, the first conductive type region 32 having a relatively wide area is entirely formed, thereby enhancing the efficiency of the process can be enhanced. However, the embodiment of the invention is not limited thereto. Accordingly, the second conductive type dopant may be doped to the semiconductor layer 30 in the deposition process for depositing the semiconductor layer 30. Also, both the first and second conductive type dopants may be doped to the semiconductor layer 30 in the deposition process for depositing the semiconductor layer 30.

Next, as shown in FIG. 4c, a capping layer 300 is formed on the semiconductor layer 30, and the heat-treating is performed at an activation heat-treatment temperature to activate the first conductive type dopant.

The capping layer 300 is entirely formed on the semiconductor layer 30 including the first conductive type region 32 and prevents the first conductive type dopants of the first conductive type region 32 from being diffused to the outside during the activation heat-treating. The capping layer 300 may be formed by one of various methods, and may include one or more of various materials.

For example, the capping layer 300 may be a layer formed by a deposition process or a thermal oxidation process. In this instance, the capping layer 300 may include a material the same as or similar as the tunneling layer 20. As an example, the capping layer 300 may include a silicon oxide. For example, the capping layer 300 may be a silicon oxide formed by the thermal oxidation process performed under process conditions the same as or similar to the process conditions of the tunneling layer 20. The capping layer 300 may have a thickness of about 50 nm to about 100 nm. When the thickness of the capping layer 300 is below about 50 nm, the effect of the capping layer 300 may be not sufficient. When the thickness of the capping layer 300 is above about 100 nm, the time and the cost for forming the capping layer 300 may increase. However, the embodiment of the invention is not limited thereto. The material and the thickness of the capping layer 300 may be varied.

When the capping layer 300 is formed of the material the same as or similar to the tunneling layer 20 as stated in the above, the tunneling layer 20, the semiconductor layer 30, and the capping layer 300 are formed by the in-situ process. Since the capping layer 300 needs not be uniform unlike the tunneling layer 20, and the thickness of the capping layer 300 is very large compared with the tunneling layer 20, the process conditions of the capping layer 300 may be different form the process conditions of the tunneling layer 20.

For example, the atmosphere of forming the capping layer 300 is the same as or similar to the atmosphere of forming the tunneling layer 20. Thus, the atmosphere of forming the capping layer 300 may include an oxygen gas, a chlorine gas, and a nitrogen gas. However, the chlorine gas may be included by an amount the same as or larger than an amount of the oxygen gas so that the capping layer 300 can be quickly grown to have a thickness larger than the tunneling layer 20. For example, the volume ratio of the oxygen gas:the chlorine gas may be in a range of about 1:1 to about 1:100 (more particularly, about 1:25 to about 1:100). According to this, the grow rate can be increased by the chlorine gas and the capping layer 300 can be quickly grown, thereby reducing the process time. However, the embodiment of the invention is not limited to thereto, and the atmosphere may be varied.

The pressure, the temperature, and the process time of the thermal oxidation process for forming the capping layer 300 may be larger than the pressure, the temperature, and the process time of the thermal oxidation process for forming the tunneling layer 20, respectively. For example, the pressure of the thermal oxidation process for forming the capping layer 300 may be in a range from about 1.5 Torr to about 2.0 Torr, the temperature of the thermal oxidation process for forming the capping layer 300 may be in a range from about 700° C. to about 900° C., and the process time of the thermal oxidation process for forming the capping layer 300 may be in a range from about 10 minutes to about 60 minutes. These pressure, temperature, and process time are limited to be suitable for forming the capping layer 300, but the embodiment of the invention is not limited thereto.

The process forming the capping layer 300 may be not necessary, and the process forming the capping layer 300 may be omitted according to an embodiment of the invention.

In addition, when an activation heat-treating for activating the first conductive type dopant is performed after doping the first conductive type dopant, the properties of the first conductive type region 32 can be enhanced. Particularly, when the first and second conductive type dopants are doped by an ion-implantation method, the properties of the first conductive type region 32 can be enhanced by the activation heat-treating. More particularly, the first conductive type dopant may be positioned at a position other than a lattice after doping the first conductive type dopant, the first conductive type dopant positioned at the position other than the lattice may not act as the dopant. That is, the first conductive type dopant is transferred to the lattice by the activation heat-treating after the doping, and thus, the first conductive type dopant can effectively act as the dopant. However, the activation heat-treating is not necessary. Thus, the activation heat-treating may be omitted or may be performed at the other process, not immediately after the doping.

For example, the activation heat-treating may be performed under the temperature, the pressure, and the atmosphere the same as or similar to those of forming the capping layer 300. In this instance, the activation heat-treating may be performed after forming the capping layer 300. Selectively, the activation heat-treating may be performed at the process forming the capping layer 300, or the activation heat-treating may include the process of forming the capping layer 300.

Selectively, the activation heat-treating may be performed by differentiating one of the temperature, the pressure, and the atmosphere of the forming process of the semiconductor layer 30 and the capping layer 300. In this instance, the activation heat-treating may be formed after forming the capping layer 300. For example, the temperature of the activation heat-treating may be higher than the temperature of the semiconductor layer 30 and the temperature of the capping layer 300. Accordingly, the effect by the activation heat-treating can be maximized.

In the embodiment of the invention, the activation heat-treating may be performed under the pressure of about 1.0 Torr to about 2.0 Torr, the temperature of about 800° C. to 900° C., and the atmosphere of a nitrogen atmosphere for about 10 minutes to about 60 minutes. Then, the effect of the activation heat-treating can be maximized by the temperature, the pressure, and the atmosphere suitable for the activation heat-treating.

The tunneling layer 20, the semiconductor layer 30, the capping layer 300, and the activation heat-treating may be formed by an in-situ process. In this instance, the activation heat-treating is performed under the low pressure at a low pressure chemical vapor deposition apparatus, along with the tunneling layer 20, the semiconductor layer 30, and the capping layer 300, and thus, variation of the temperature can be reduced. Accordingly, the semiconductor substrate 10 and the semiconductor layer 30 can be uniformly activated by the activation heat-treating.

It is exemplified that the capping layer 300 is formed on the first conductive type region 32 having the first conductive type dopant and the first conductive type dopant is activated by the activation heat-treating in the embodiment of the invention, but the embodiment of the invention is not limited thereto. Therefore, the capping layer 300 may be formed on the semiconductor layer 30 being intrinsic (see FIG. 3c). In this instance, during an annealing heat-treating of the semiconductor layer 30 being intrinsic (for example, a heat-treating for annealing the semiconductor layer 30 being intrinsic and being amorphous to the semiconductor layer 30 being intrinsic and having poly-crystalline), the semiconductor layer 30 can be prevented from being polluted by an external pollutant source and the effect of the annealing heat-treating can be enhanced, thereby enhancing the crystalline property of the semiconductor layer 30. The capping layer 300 may be applied to various processes to achieve various effects.

Next, as shown in FIG. 4d, the capping layer 300 is removed. The capping layer 300 may be removed by various methods, for example, by a diluted HF. However, the embodiment of the invention is not limited thereto.

Figure 4E:
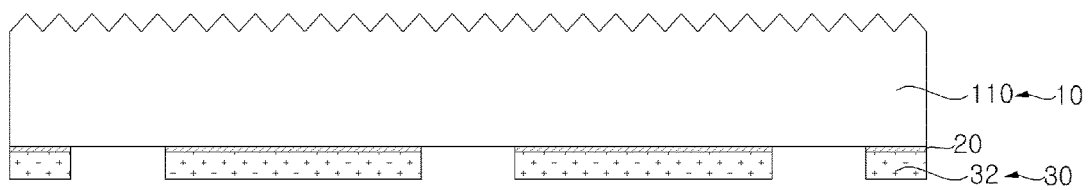

Next, as shown in FIG. 4e, portions of the semiconductor layer 30 and the tunneling layer 20 corresponding to the second conductive type region 34 (in FIG. 4f) are removed. Various methods may be applied to remove the portions of the tunneling layer 20 and the semiconductor layer 30. For example, an etching may be applied. However, the embodiment of the invention is not limited thereto.

Figure 4F:
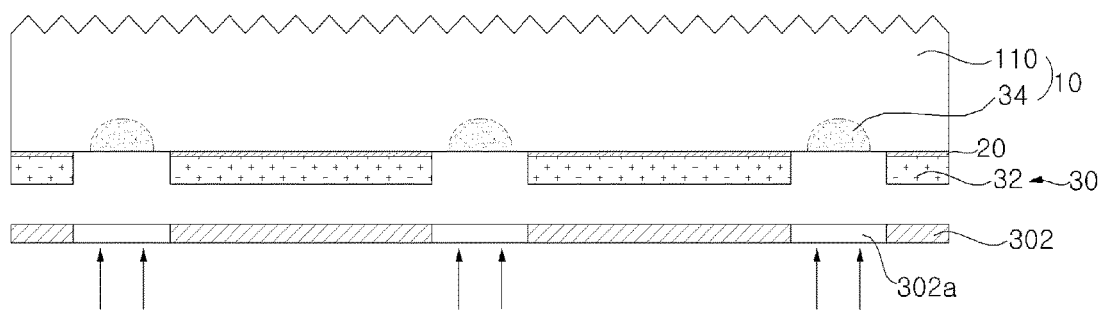

Next, as shown in FIG. 4f, a second conductive type region 34 is formed at a portion of the semiconductor substrate 10 corresponding to an opening (or openings) 302a of a mask 302 by doping the second conductive type dopant. In this instance, various methods such as an ion implantation method or a thermal oxidation may be applied to the doping method.

Figure 4G:
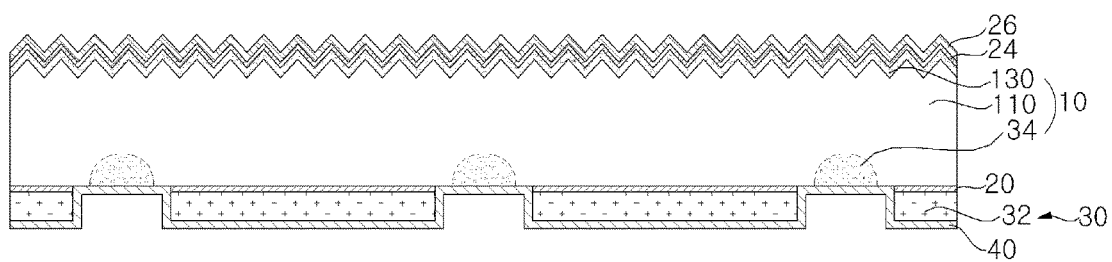

Next, as shown in FIG. 4g, a front surface field region 130, a passivation layer 24, and an anti-reflective layer 26 are sequentially formed on the front surface of the semiconductor substrate 10, and an insulating layer 40 for covering the semiconductor substrate 10 and the semiconductor layer 30 including the first conductive type region 32 is formed on the back surface of the semiconductor substrate 10. In this instance, the insulating layer 40 may be formed on a back surface and side surfaces of the semiconductor layer 30 including the first conductive type region 32, and the back surface of the semiconductor substrate 10 exposed at a portion where the semiconductor layer 30 is not formed.

Figure 4H:
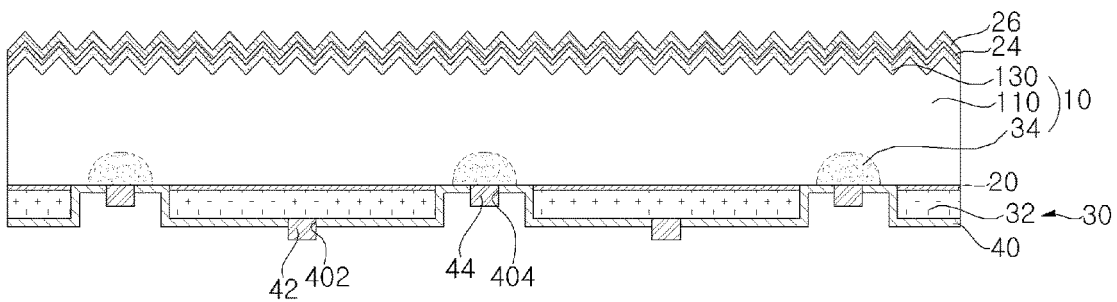

Next, as shown in FIG. 4h, the first and second electrodes 42 and 44 electrically connected respectively to the first and second conductive type regions 32 and 34 are formed.

In the solar cell 100a according to embodiment of the invention, the second conductive type region 34 having a relatively small area is formed at the semiconductor substrate 10, and the first conductive type region 32 having a relatively large area is formed on the tunneling layer 20 positioned on the semiconductor substrate 10. According to this, the property deterioration and the damage of the semiconductor substrate 10 that may be induced during the doping process for doping the dopant to the semiconductor substrate 10 can be effectively prevented. Also, the first conductive type region 32 and the second conductive type region 34 are separately formed at separated spaces, and thus, the shunt that may be induced when the first conductive type region 32 and the second conductive type region 34 are in contact with each other can be prevented. Accordingly, an open-circuit voltage and a fill factor of the solar cell 100a can be enhanced, thereby enhancing efficiency of the solar cell 100a.

In this instance, the first conductive type dopant is doped to the semiconductor layer 30 during the forming process of the semiconductor layer 30, and thus, the process can be simplified. Also, at least two processes of the tunneling layer 20, the semiconductor layer 30, the capping layer 300, and the activation heat-treating can be continuously performed in the same apparatus (for example, a low pressure chemical vapor deposition apparatus). Thus, the process can be minimized.

Hereinafter, one or more embodiments of the invention will be described more fully with reference to the following examples. However, these examples are provided for illustrative purposes only and are not intended to limit the scope of the embodiments of the invention.

EXPERIMENTAL EXAMPLE 1

A thermal oxidation process of a semiconductor substrate formed of a silicon wafer was performed for 10 minutes at a low pressure chemical vapor deposition apparatus to form a tunneling layer. At the low pressure chemical vapor deposition apparatus, the pressure was 0.9 Torr, the temperature was 700° C., and the atmosphere included an oxygen gas, a chlorine gas, and a nitrogen gas.

First and second conductive type regions interposing a barrier region therebetween were formed on the tunneling layer, an insulating layer, a passivation layer, and an anti-reflection layer were formed, and first and second electrode connected the first and second conductive type regions were formed. Accordingly, a solar cell was manufactured.

EXPERIMENTAL EXAMPLE 2

A solar cell was formed in the same manner as in Experimental Example 1, except that the pressure of forming the tunneling layer was 1.1 Torr.

EXPERIMENTAL EXAMPLE 3

A solar cell was formed in the same manner as in Experimental Example 1, except that the pressure of forming the tunneling layer was 1.3 Torr.

COMPARATIVE EXAMPLE 1

A solar cell was formed in the same manner as in Experimental Example 1, except that the pressure of forming the tunneling layer was 3.0 Torr.

Figure 5:
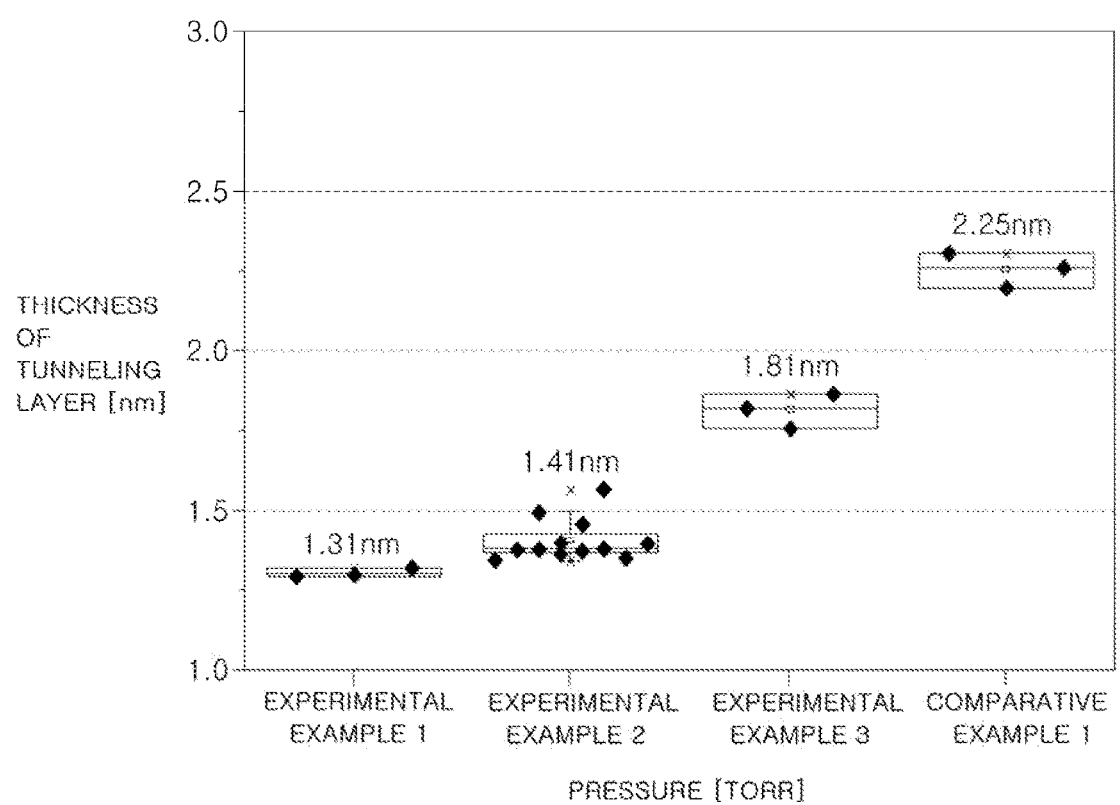
FIG. 5 is a graph of thicknesses of tunneling layers of the solar cells manufactured according to Experimental Examples 1 to 3 and Comparative Example 1.

Thicknesses of the tunneling layers of the solar cells manufactured according to Experimental Examples 1 to 3 and Comparative Example 1 are shown in FIG. 5. For reference, a plurality of solar cells were manufactured in each of Experimental Examples 1 to 3 and Comparative Example 1, and a thickness average of tunneling layers of the plurality of solar cells are shown in FIG. 5.

Referring to FIG. 5, it can be seen that the thickness averages by Experimental Examples 1 to 3 are 1.31 nm, 1.41 nm, and 1.81 nm, respectively, that are under 2 nm. Particularly, it can be seen that the thickness averages of the tunneling layers are 1.31 nm or 1.41 nm that is 1.5 nm or less when the pressure is 1.3 Torr or 1.1 Torr that is 1.5 Torr or less. On the other hand, it can be seen that the thickness average of the tunneling layers according to Comparative Example 1 is 2.25 nm that is larger than 2 nm.

Figure 6:
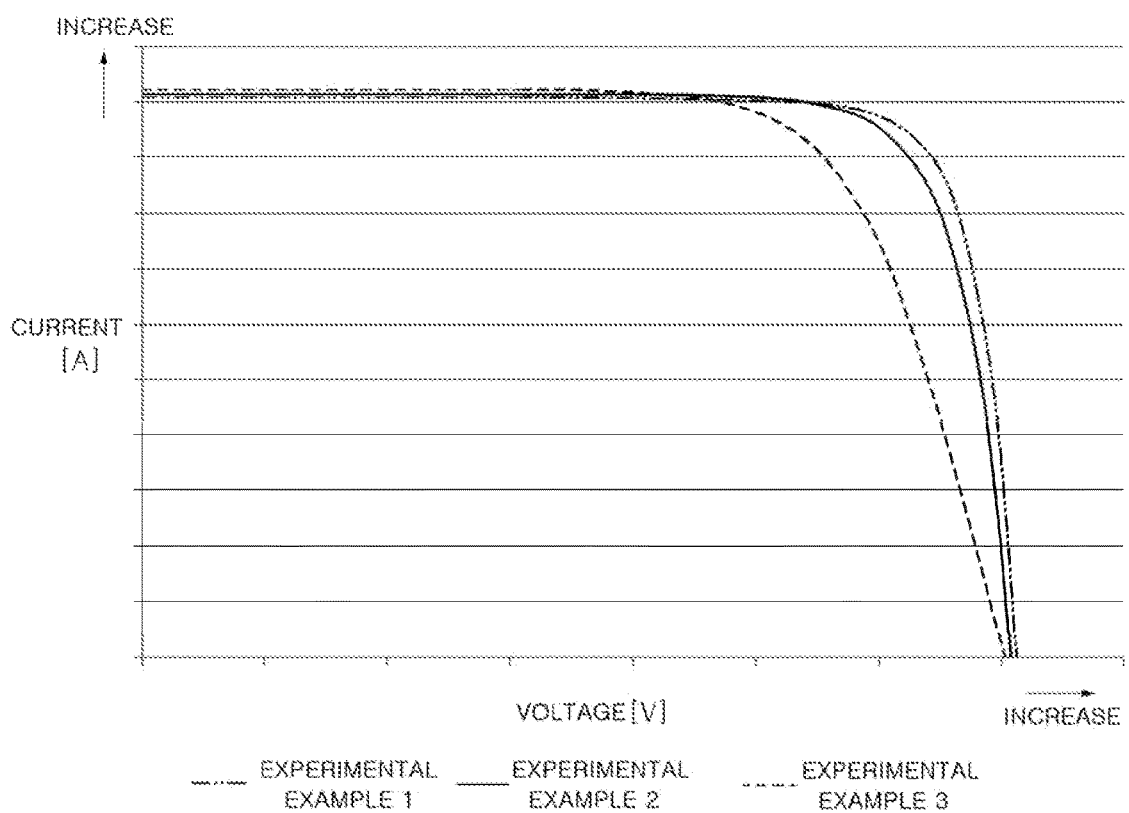
FIG. 6 is a current (I)-voltage (V) graph of the solar cells according to Experimental Examples 1 to 3 and Comparative Example 1.
Figure 7:
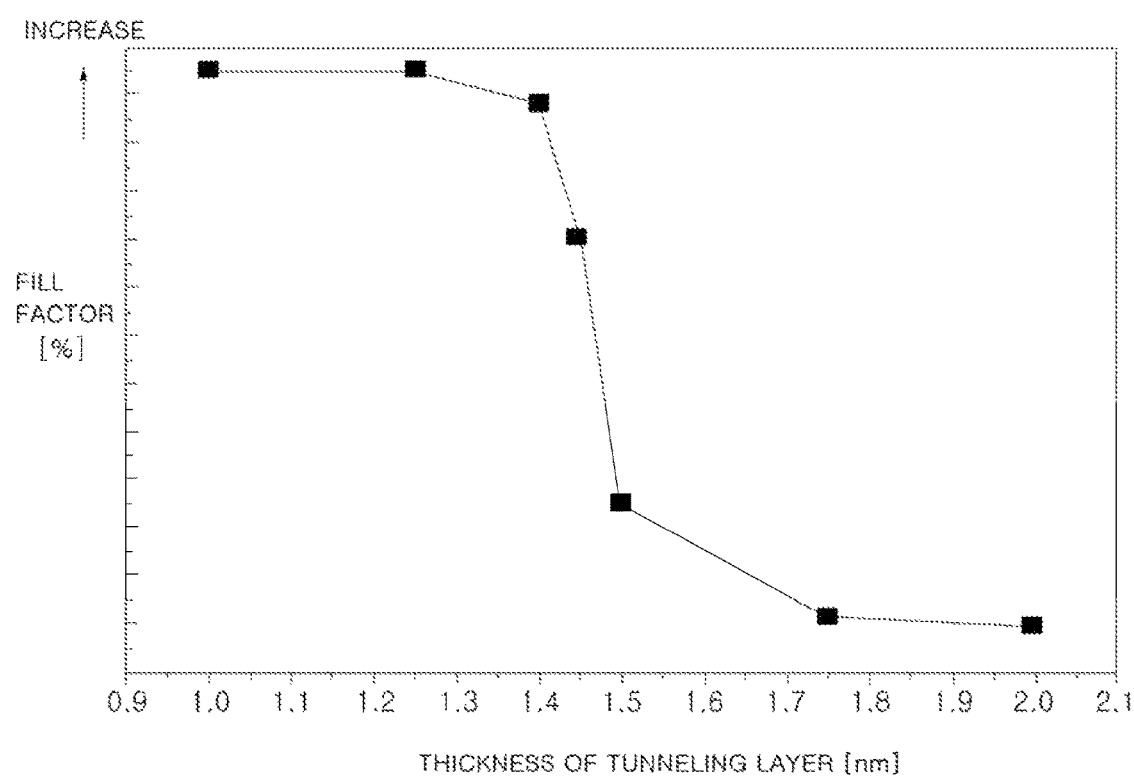
FIG. 7 is a fill-factor graph according to a thickness of a tunneling layer.

Currents (I)-voltages (V) of the solar cell having the tunneling layer of the average thickness in Experimental Examples 1 to 3 and Comparative Example 1 were measured, and the current-voltage graph is shown in FIG. 6. Also, fill factors were calculated from the current-voltage graphs of all solar cells used in Experimental Examples 1 to 3 and from the current-voltage graphs of solar cells having tunneling layers having various thicknesses, and the fill-factor graph according to the thickness of the tunneling layer is shown in FIG. 7.

Referring to FIG. 6, it can be seen that the fill factor corresponding to an area under the curve of the current-voltage graph decreases as the thickness of the tunneling layer increases. Referring to FIG. 7, it can be seen that the fill factor is very low when the thickness of the tunneling layer is above 2 nm. Particularly, it can be seen that the fill factor has an very excellent value when the thickness of the tunneling layer is 1.5 nm or less (particularly, when the tunneling layer is 1.4 nm or less and, more particularly, when the tunneling layer is 1.3 nm or less).

That is, according to the embodiment of the invention, the tunneling layer having a small thickness (for example, 2 nm or less, more particularly, 1.5 nm or less) can be formed, and thus, the fill factor of the solar cell 100 can be largely enhanced.

Particular characteristics, structures, or effects described in connection with the embodiment of the invention are included in at least one embodiment of the embodiment of the invention and not necessarily in all embodiments of the invention. Furthermore, the particular characteristics, structures, or effects of any specific embodiment of the embodiment of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiment of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments. In addition, it is to be understood that differences relevant to the variations and modifications fall within the spirit and scope of the embodiment of the invention defined in the appended claims.

What is claimed is:

1. A method for manufacturing a solar cell, the method comprising:
   forming a tunneling layer on a semiconductor substrate;
   forming a semiconductor layer on the tunneling layer, wherein the forming of the semiconductor layer includes depositing a semiconductor material;
   forming a capping layer on the semiconductor layer; and
   forming an electrode connected to the semiconductor layer,
   wherein the tunneling layer is formed under a temperature higher than room temperature and a pressure lower than atmospheric pressure,
   wherein a pressure of the forming of the semiconductor layer is smaller than the pressure of the forming of the tunneling layer,
   wherein the forming of the semiconductor layer further comprises doping the semiconductor layer with dopants,
   wherein the capping layer is formed between the forming of the semiconductor layer and the forming of the electrode, and
   wherein the forming of the tunneling layer, the forming of the semiconductor layer, and the forming of the capping layer are performed by an in-situ process continuously performed in a same apparatus.

2. The method according to claim 1, wherein the semiconductor layer comprises:
   a first conductive type region comprising a first conductive type dopant;
   a second conductive type region comprising a second conductive type dopant different from the first conductive type dopant; and
   a barrier region between the first conductive type region and the second conductive type region,
   wherein the first conductive type region, the second conductive type region, and the barrier region are on the tunneling layer.

3. The method according to claim 1, wherein, in the forming of the tunneling layer, the temperature is in a range from about 600° C. to about 800° C. and the pressure is in a range from about 0.01 Torr to about 2 Torr.

4. The method according to claim 1, wherein the forming of the tunneling layer is performed for about 5 minutes to about 30 minutes.

5. The method according to claim 1, wherein the forming of the tunneling layer is performed under an atmosphere including an oxygen gas, and
   the tunneling layer comprises an oxide.

6. The method according to claim 5, wherein the tunneling layer comprises a thermal oxidation layer formed by a thermal oxidation process.

7. The method according to claim 5, wherein the atmosphere of the forming of the tunneling layer further comprises a nitrogen gas and a chlorine gas.

8. The method according to claim 1, wherein the tunneling layer has a thickness of about 1.0 nm to about 1.5 nm.

9. The method according to claim 1, wherein the forming of the tunneling layer, the forming of the semiconductor layer, and the forming of the capping layer are performed at a low pressure chemical vapor deposition apparatus.

10. The method according to claim 1, wherein the forming of the tunneling layer and the forming of the semiconductor layer are performed under different atmospheres.

11. The method according to claim 10, wherein the forming of the tunneling layer is performed under an atmosphere including an oxygen gas, and
    the forming of the semiconductor layer is performed under an atmosphere including a gas including silicon.

12. The method according to claim 1, wherein a difference between the temperature of the forming of the tunneling layer and a temperature of the forming of the semiconductor layer is 200° C. or less.

13. The method according to claim 1, wherein the pressure of the forming of the tunneling layer is in a range of about 0.01 Torr to about 2 Torr, and
    the pressure of the forming of the semiconductor layer is in a range of about 0.01 Ton to about 0.5 Torr.

14. The method according to claim 13, wherein the semiconductor layer is thicker than the tunneling layer.

15. The method according to claim 1, further comprising:
    heat-treating the semiconductor layer for an activation between the forming of the capping layer and the forming of the electrode, and
    wherein the forming of the tunneling layer, the forming of the semiconductor layer, the forming of the capping layer, and the heat-treating are performed by an in-situ process continuously performed in the same apparatus.

16. A solar cell manufactured by the method according to claim 1, wherein the tunneling layer of the solar cell has a thickness of about 2 nm or less.

17. The method according to claim 1, wherein the capping layer includes silicon oxide, and has a thickness of about 50 nm to 100 nm.

18. The method according to claim 1, wherein the capping layer is thicker than the tunneling layer.

* * * * *